(12) United States Patent
Lau et al.

(10) Patent No.: US 12,016,111 B2
(45) Date of Patent: Jun. 18, 2024

(54) PROTECTIVE ENCLOSURE FOR AN ELECTRONIC DEVICE

(71) Applicant: Western Digital Technologies, Inc., San Jose, CA (US)

(72) Inventors: Chun Sean Lau, Penang (MY); Ahmad Faridzul Hilmi Shamsuddin, Penang (MY); Bo Yang, Dublin, CA (US); Shankara Venkatraman Gopalan, Bangalore (IN); Warren Middlekauff, Milpitas, CA (US); Ning Ye, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 177 days.

(21) Appl. No.: 17/724,689

(22) Filed: Apr. 20, 2022

(65) Prior Publication Data

US 2023/0345614 A1 Oct. 26, 2023

(51) Int. Cl.
*H05K 1/02* (2006.01)
*B23K 1/00* (2006.01)
*H05K 3/30* (2006.01)
*H05K 5/00* (2006.01)
*B23K 101/42* (2006.01)

(52) U.S. Cl.
CPC ......... *H05K 1/0204* (2013.01); *B23K 1/0008* (2013.01); *H05K 3/303* (2013.01); *H05K 5/0047* (2013.01); *B23K 2101/42* (2018.08)

(58) Field of Classification Search
CPC ...... H05K 1/0204; H05K 5/0047; H05K 7/20; H05K 7/2039; H01L 21/4871; H01L 21/56; H01L 23/04; H01L 23/13; H01L 23/2107; H01L 23/34; H01L 23/367; H01L 23/3675; H01L 23/373; H01L 23/40; H01L 23/4006; H01L 23/4087; H01L 23/42; H01L 23/552; H01L 25/0655; H01L 2023/4087; B23K 1/0008; B23K 2101/42
See application file for complete search history.

(56) References Cited

U.S. PATENT DOCUMENTS 6,377,461 B1 * 4/2002 Ozmat .................... H01L 24/24
257/E21.705
9,781,863 B1 * 10/2017 Kim ...................... H01L 23/053
(Continued)

OTHER PUBLICATIONS

Tim 1-Reliability-of-Polymer-Solder (Year: 2012).*
(Continued)

*Primary Examiner* — Amir A Jalali
(74) *Attorney, Agent, or Firm* — Michael Best & Friedrich LLP

(57) ABSTRACT

A protective enclosure for a PCB assembly, e.g., a solid-state-drive assembly. In an example embodiment, the enclosure comprises a flexible, stamped-metal heat spreader connected, by way of cured-liquid TIM parts, to at least some of the packaged integrated circuits on one side of the PCB assembly. In some embodiments, additional cured-liquid TIM parts may be connected between the body of the protective enclosure and packaged integrated circuits on the other side of the PCB assembly and/or the assembly's PCB. The PCB assembly, heat spreader, and various TIM parts are arranged in a manner that helps to significantly lower the risk of solder-joint failure under thermal cycling.

20 Claims, 6 Drawing Sheets

(56) References Cited

U.S. PATENT DOCUMENTS

| | | | | |
|---|---|---|---|---|
| 10,342,119 | B1* | 7/2019 | Mujcinovic | H05K 5/0004 |
| 11,605,886 | B1* | 3/2023 | Refai-Ahmed | H01Q 1/42 |
| 2004/0042178 | A1* | 3/2004 | Gektin | H01L 23/433 |
| | | | | 257/E23.09 |
| 2005/0078456 | A1* | 4/2005 | Mandel | H01L 23/427 |
| | | | | 257/E23.105 |
| 2006/0126309 | A1* | 6/2006 | Bolle | H05K 7/20436 |
| | | | | 361/719 |
| 2010/0027220 | A1* | 2/2010 | Hughes | H05K 7/20445 |
| | | | | 361/702 |
| 2013/0258599 | A1* | 10/2013 | Danello | H01L 23/433 |
| | | | | 361/706 |
| 2014/0077352 | A1* | 3/2014 | Leal | H01L 24/17 |
| | | | | 257/E23.08 |
| 2015/0130045 | A1* | 5/2015 | Tseng | H01L 25/0652 |
| | | | | 438/122 |
| 2015/0255365 | A1* | 9/2015 | Lee | H01L 23/3675 |
| | | | | 257/712 |
| 2016/0005682 | A1* | 1/2016 | Leal | H01L 21/565 |
| | | | | 257/712 |
| 2020/0350231 | A1* | 11/2020 | Shen | H01L 23/4334 |
| 2022/0142016 | A1* | 5/2022 | Gradinger | H05K 7/20927 |
| | | | | 361/699 |
| 2022/0300048 | A1* | 9/2022 | Lim | G06F 1/1637 |
| 2023/0268332 | A1* | 8/2023 | Tang | H01L 23/427 |
| | | | | 257/675 |

OTHER PUBLICATIONS

Mahajan, R. Thermal Interface Materials: A Brief Review of Design Characteristics and Materials. Feb. 1, 2004. <https://www.electronics-cooling.com/2004/02/thermal-interface-materials-a-brief-review-of-design-characteristics-and-materials/> (20 pages).

* cited by examiner

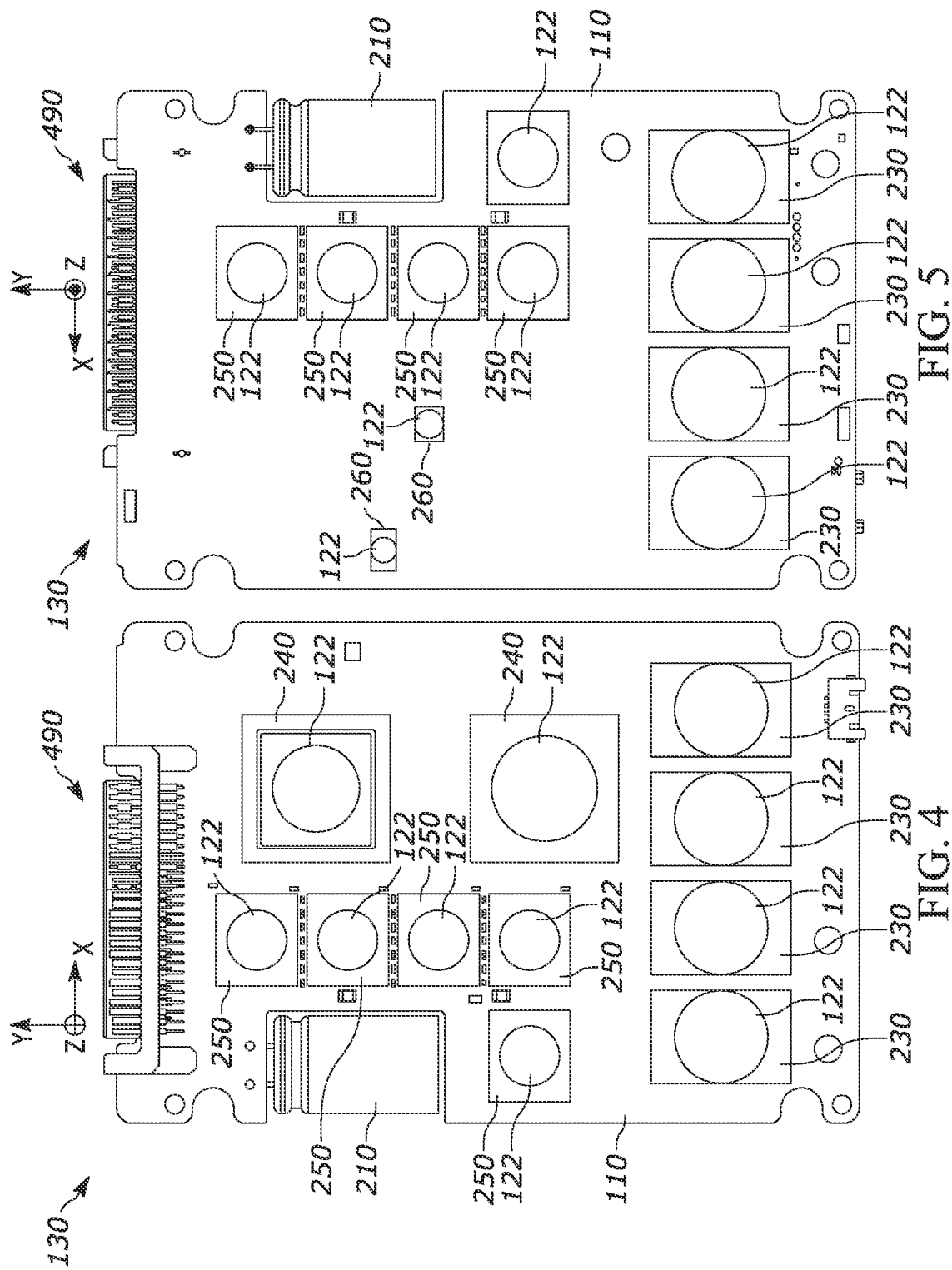

PROTECTIVE ENCLOSURE FOR AN ELECTRONIC DEVICE

FIELD

This application relates generally to protective enclosures for electronic devices, and more specifically but not exclusively, to protective enclosures employing thermal interface materials (TIMs).

BACKGROUND

This section introduces aspects that may help facilitate a better understanding of the disclosure. Accordingly, the statements of this section are to be read in this light and are not to be understood as admissions about what is in the prior art or what is not in the prior art.

In operation, many electronic components generate heat which, if not appropriately managed, might impede the performance of or damage the corresponding electronic device. For example, thermal cycling caused by repeated heating and cooling of some parts of the electronic device, e.g., by electrical ON/OFF cycling thereof, can cause solder-joint cracking on a printed circuit board (PCB) of the device. Any cracking on the PCB of the device may disadvantageously cause a premature device failure.

SUMMARY

Disclosed herein are various embodiments of a protective enclosure for a PCB assembly, e.g., a solid-state-drive assembly. In an example embodiment, the enclosure comprises a flexible, stamped-metal heat spreader connected, by way of cured-liquid TIM parts, to at least some of the packaged integrated circuits on one side of the PCB assembly. In some embodiments, additional cured-liquid TIM parts may be connected between the body of the protective enclosure and packaged integrated circuits on the other side of the PCB assembly and/or the assembly's PCB. The PCB assembly, heat spreader, and various TIM parts are arranged in a manner that helps to significantly lower the risk of solder-joint failure under thermal cycling, e.g., reduce or eliminate solder-joint cracking.

According to an example embodiment, provided is an apparatus, comprising: an enclosure comprising a base and a lid attached to one another; a printed-circuit-board assembly in the enclosure, the printed-circuit-board assembly comprising a printed circuit board and a plurality of electronic components attached to the printed circuit board; a heat spreader in the enclosure, the heat spreader being attached to the lid with portions of facing surfaces of the lid and the heat spreader being separated from each other by a non-zero distance; and one or more first TIM parts, each of the one or more first TIM parts being in contact with and vertically between the heat spreader and a corresponding one of the electronic components.

According to another example embodiment, provided is a manufacturing method, comprising: attaching a printed-circuit-board assembly to a base, the printed-circuit-board assembly comprising a printed circuit board and a plurality of electronic components attached to the printed circuit board; forming a sub-assembly by attaching a heat spreader to a lid with portions of facing surfaces of the lid and the heat spreader being separated from each other by a non-zero distance; depositing one or more drops of a fluid TIM onto the subassembly; and attaching the subassembly to the base to enclose the printed-circuit-board assembly therebetween such that each of the one or more drops is in contact with and vertically between the heat spreader and a corresponding one of the electronic components.

According to yet another example embodiment, provided is a solid-state drive assembled using a manufacturing method, the manufacturing method comprising: attaching a printed-circuit-board assembly to a base, the printed-circuit-board assembly comprising a printed circuit board and a plurality of electronic components attached to the printed circuit board; forming a sub-assembly by attaching a heat spreader to a lid with portions of facing surfaces of the lid and the heat spreader being separated from each other by a non-zero distance; depositing one or more drops of a fluid TIM onto the subassembly; and attaching the subassembly to the base to enclose the printed-circuit-board assembly therebetween such that each of the one or more drops is in contact with and vertically between the heat spreader and a corresponding one of the electronic components.

BRIEF DESCRIPTION OF THE DRAWINGS

Other aspects, features, and advantages of example embodiments will become more fully apparent from the following detailed description, the appended claims, and the accompanying drawings in which like reference numerals identify similar or identical elements. Note that elements in the figures may not be drawn to scale.

FIGS. 4-5 are plan views of a PCB assembly that can be used in the device assembly of FIG. 2 according to example embodiments.

DETAILED DESCRIPTION

Figure 1:
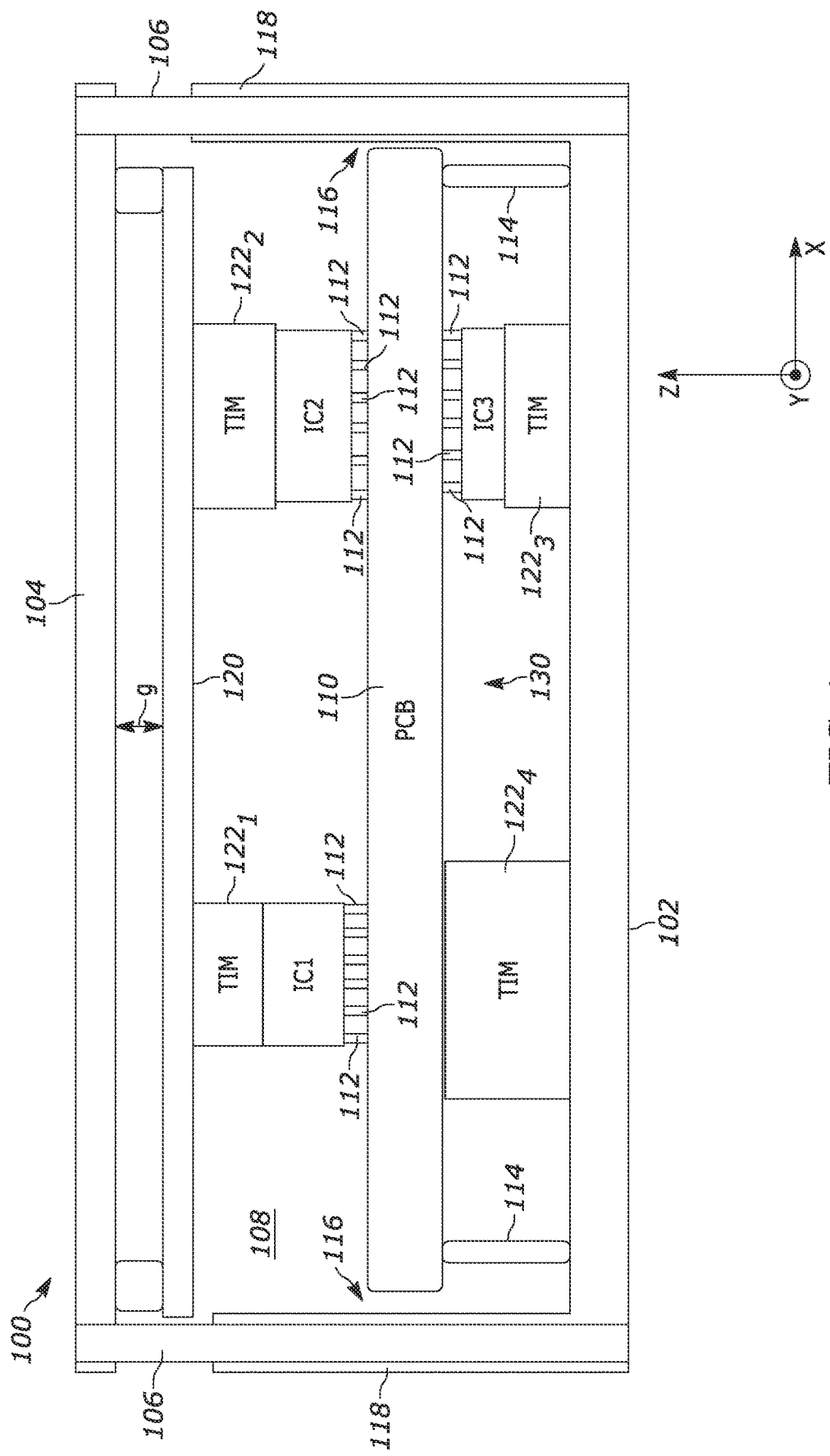
FIG. 1 is a cross-sectional side view of a device assembly according to an embodiment.

A coefficient-of-thermal-expansion (CTE) mismatch between a PCB and a circuit component mounted thereon can induce mechanical stress and/or strain when the temperature is changed. Repeated temperature changes may typically subject parts of the corresponding circuit to cyclic mechanical loading/unloading, which is known to cause metal fatigue. In material science, the term "fatigue" refers to the initiation and propagation of cracks in a material (e.g., metal) due to cyclic loading/unloading. Once a fatigue crack has initiated, the crack can grow by a small amount with each loading/unloading cycle. The crack may typically continue to grow until it reaches a critical size, at which point rapid crack propagation may occur to cause a complete fracture of the affected structure.

In a typical electronic device, a PCB/component CTE difference may be on the order of 10 ppm/K, with the CTE of the component typically being the lower CTE. When an enclosure is used to protect the electronic device, the top and bottom halves of the enclosure may typically be made of an aluminum alloy whose CTE value is by approximately 10 ppm/K higher than that of the PCB. As a result, the protective enclosure may act to increase the effective CTE of the PCB with respect to that of the component(s) thereon, thereby exacerbating the above-described fatigue phenomena.

The above-indicated and possibly some other related problems in the state of the art may beneficially be addressed using at least some embodiments disclosed herein. For example, a protective enclosure according to an embodiment of this disclosure may employ stamped sheet-metal and TIM parts arranged and assembled in a manner that helps to reduce both temperature gradients at and CTE-mismatch-induced mechanical loading of fatigue-susceptible elements, such as solder joints of the electronic device. This reduction can beneficially manifest itself in a corresponding reduction in the frequency of premature device failures.

Herein, the term "TIM" generally refers to a material that, if inserted between two components, enhances the thermal coupling between them. For example, a TIM may be used for heat dissipation, e.g., when inserted between a heat-producing circuit component and a heat sink. The semiconductor industry and its suppliers develop, use, and sell a large variety of TIMs suitable for different specific applications, such as for minimizing the thermal-boundary resistance between layers, enhancing thermal-management performance, lowering thermal stress between materials having different CTE values, providing a relatively low elastic modulus, achieving good flexibility, etc. For example, the following TIM types may currently be available in the market: (i) thermal paste; (ii) thermal adhesive; (iii) thermal gap filler; (iv) thermally conductive pads; (v) thermal tape; (vi) phase-change materials; and (vii) solid (e.g., metal) TIMs. Some TIMs may be supplied in a fluid (e.g., gel-like) form for convenient application and are typically cured into a solid form after being placed into the product. Depending on the specific characteristics and chemical composition of such TIMs, the curing process may involve an elevated temperature, exposure to light, or application of a chemical stimulus.

FIG. 1 is a simplified cross-sectional side view of a device assembly 100 according to an embodiment. As shown, device assembly 100 comprises a base 102 and a top lid 104 attached to one another, e.g., by a set of screws 106, to form an enclosed space 108 therebetween. In an example embodiment, base 102 and top lid 104 can be die-cast metal (e.g., aluminum) parts. In some embodiments, top lid 104 can be a stamped sheet-metal part.

Enclosed in device assembly 100 is a PCB assembly (PCBA) 130 comprising a PCB 110 and a plurality of circuit/device components fixedly mounted thereon and electrically interconnected, e.g., using solder joints and patterned conductors of the PCB. As a non-limiting example, FIG. 1 shows three integrated circuits (ICs), labeled IC1, IC2, and IC3, respectively, mounted in this manner on two opposing main surfaces of PCB 110. Circuits IC1 and IC2 are mounted on a first (illustratively, upper) main surface of PCB 110, whereas circuit IC3 is mounted on a second (illustratively, lower) main surface of PCB 110. In various embodiments, the numbers of such circuits mounted on the upper and/or lower surfaces of PCB 110 may vary.

Herein, a "main plane" of an object, such as a die, a substrate, an IC, or a PCB is a plane parallel to a substantially planar surface thereof that has about the largest area among exterior surfaces of the object. This substantially planar surface may be referred to as a main surface. The exterior surfaces of the object that have one relatively large size, e.g., length, but are of much smaller area, e.g., less than one quarter of the main-surface area, are typically referred to as the edges of the object.

Herein, the term "vertical" refers to a direction that is approximately orthogonal to a main plane of PCB 110. In FIG. 1, a vertical direction is parallel to the Z-coordinate axis. The term "horizontal" refers to a direction that is approximately parallel to said main plane of PCB 110. In FIG. 1, a horizontal plane is parallel to the XY-coordinate plane.

Also mounted on PCB 110 may be one or more discrete circuit elements, such as capacitors, inductors, resistors, and/or active devices (not explicitly shown in FIG. 1; e.g., see FIGS. 4-5). Some of the circuits IC1-IC3 may be nominally identical, e.g., may represent different instances of the same circuit. Some of the circuits IC1-IC3 may differ from one another. For example, in some embodiments, circuit IC1 can be a processor or controller, whereas circuits IC2 and IC3 may be solid-state memory circuits. In other embodiments, other combinations of circuits may similarly be used. In various embodiments, PCB 110 can be double sided (e.g., having conductive tracks arranged in two surface layers, as indicated in FIG. 1), single sided (e.g., having conductive tracks or traces arranged in a single surface layer), or multi-layered (e.g., having a multi-layer stack of conductive tracks electrically interconnected using vertical conductive vias).

As used herein, the term "integrated circuit" (or IC) should be construed to encompass both a non-packaged die and a packaged die. In a typical IC-fabrication process, dies are produced in relatively large batches using wafers of silicon or other suitable material(s). Electrical circuits can be gradually created on a wafer using a multi-step sequence of photolithographic and chemical processing steps. Each wafer is then cut ("diced") into many pieces, each containing a respective copy of the circuit that is being fabricated. Each individual die can be appropriately packaged prior to being incorporated into a larger circuit or be left non-packaged.

Circuits IC1-IC3 are illustratively shown in FIG. 1 as being attached and electrically connected to PCB 110 using solder joints (balls, dots, bumps) 112. An example packaged IC, such as each of circuits IC1-IC3, may typically have small metal pads arranged in a two-dimensional area array on a main surface thereof. Small solder balls (precursors of solder joints 112) may be deposited on each metal pad. The solder balls may then be fluxed, and the IC may be placed on the corresponding area of PCB 110. The solder may then be reflowed, e.g., by being heated to above its melting temperature, to form permanent electrical connections, which include solder joints 112, between the IC and the facing metal layer of PCB 110. In some cases, such permanent electrical connections may be susceptible to metal fatigue, e.g., as explained above.

In an example embodiment, PCB 110 may be attached to base 102 using a second set of screws 114. Note that screws 114 are only connected between PCB 110 and base 102 and are not directly connected to top lid 104, e.g., as indicated in FIG. 1. Typically, there are small air gaps, e.g., gaps 116, between and defined by the edges of PCB 110 and side walls 118 of device assembly 100. In other embodiments, other suitable fastening elements and/or support pins may also be used.

Device assembly 100 further comprises a set of TIM parts, which are labeled 120 and $122_1$-$122_4$, respectively. TIM part 120 is a solid (e.g., metal) heat spreader. TIM parts $122_1$-$122_4$ are cured-liquid TIM parts. In operation, TIM parts 120 and $122_1$-$122_4$ may help to remove excessive heat from circuits IC1-IC3 and PCB 110 for dissipation through exterior surfaces of device assembly 100. TIM parts 120 and $122_1$-$122_4$ may also help to reduce temperature gradients within space 108.

Figure 3:
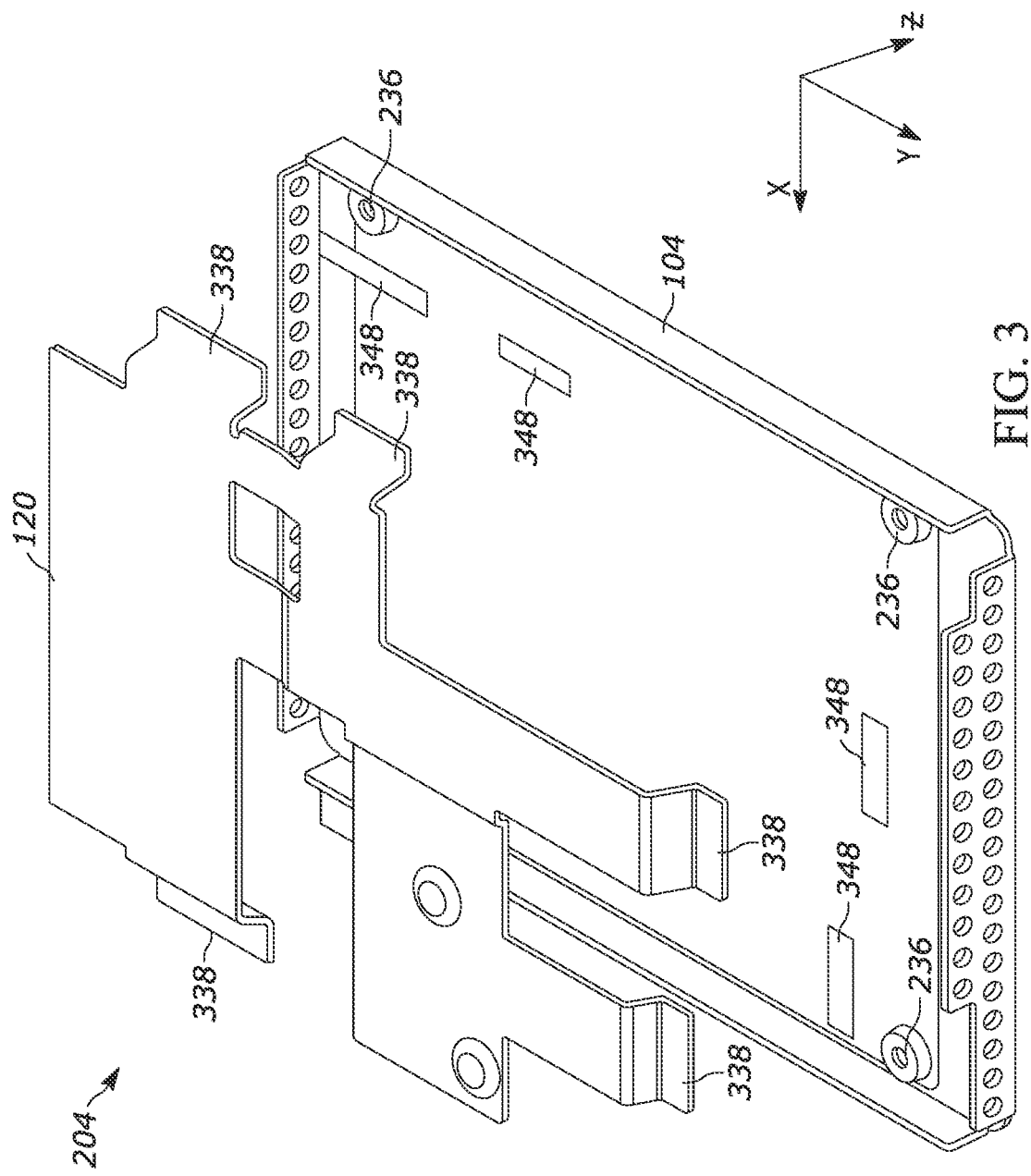
FIG. 3 is a three-dimensional view illustrating a subassembly that can be used in the device assembly of FIG. 2 according to an embodiment.
Figure 7:
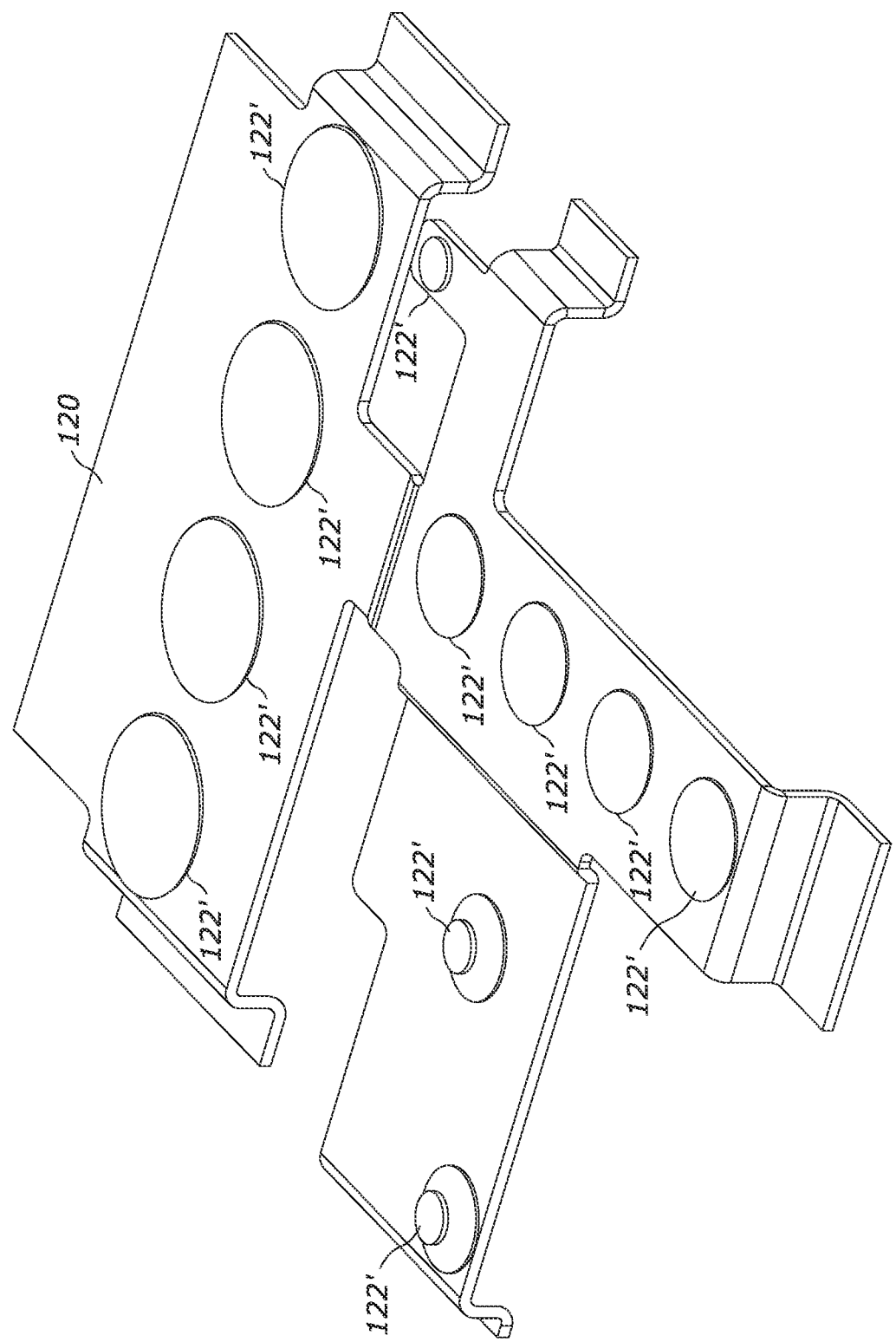
FIG. 7 pictorially illustrates one of the parts that can be used in the method of FIG. 6 according to an embodiment.

In an example embodiment, heat spreader 120 can be a stamped sheet-metal part attached to top lid 104 using thermal double-sided tape, glue, spot welding, or other suitable attachment feature. The thickness of the sheet metal can be, e.g., about 1 mm or less to allow for some amount of flexing in at least some parts of heat spreader 120. The gap, g, between the facing main surfaces of heat spreader 120 and top lid 104 can be, e.g., in the range between 3 mm and 5 mm. Although heat spreader 120 is illustratively shown in FIG. 1 as being flat, embodiments are not so limited. More specifically, various suitable non-flat shapes may be used to implement heat spreader 120, with the specific shapes being selected based on the vertical profile of the ICs and other circuit components mounted on PCB 110, e.g., as illustrated in FIGS. 3 and 7.

Cured-liquid TIM parts $122_1$ and $122_2$ are located between heat spreader 120 and integrated circuits IC1 and IC2, respectively. More specifically, cured-liquid TIM part $122_1$ is in direct physical contact with the top surface of circuit IC1 and the facing portion of the bottom surface of heat spreader 120. Similarly, cured-liquid TIM part $122_2$ is in direct physical contact with the top surface of circuit IC2 and the facing portion of the bottom surface of heat spreader 120. Cured-liquid TIM part $122_3$ is located between base 102 and circuit IC3. More specifically, cured-liquid TIM part $122_3$ is in direct physical contact with the bottom surface of circuit IC3 and the facing portion of the top surface of base 102. Cured-liquid TIM part $122_4$ is located between base 102 and PCB 110 and is in direct physical contact with the bottom surface of the PCB and the facing portion of the top surface of the base.

At least some of the above-described features of device assembly 100 may advantageously contribute to a significant reduction (e.g., by approximately 20%) in the fatigue-inducing forces acting on solder joints 112 of PCBA 130 compared to those occurring in other protective-enclosure designs for comparable devices. For example, screws 114 and gaps 116 may be configured such as to allow for sufficient movement of the edges of PCB 110, which may reduce the magnitude of heat-induced in-plane (i.e., XY) stresses and strains acting on solder joints 112 at the PCB surface. In addition, the above-mentioned flexibility of heat spreader 120 enables the heat spreader to flex up and down, thereby likely reducing the magnitude of heat-induced out-of-plane (i.e., Z) stresses and strains acting on solder joints 112. Furthermore, the overall configuration of TIM parts 120 and $122_1$-$122_4$ may be selected such as to realize a sizable reduction in the peak temperatures and magnitudes of temperature gradients within device assembly 100, which may further help to reduce the adverse effects of temperature cycling on the solder joints.

Figure 2:
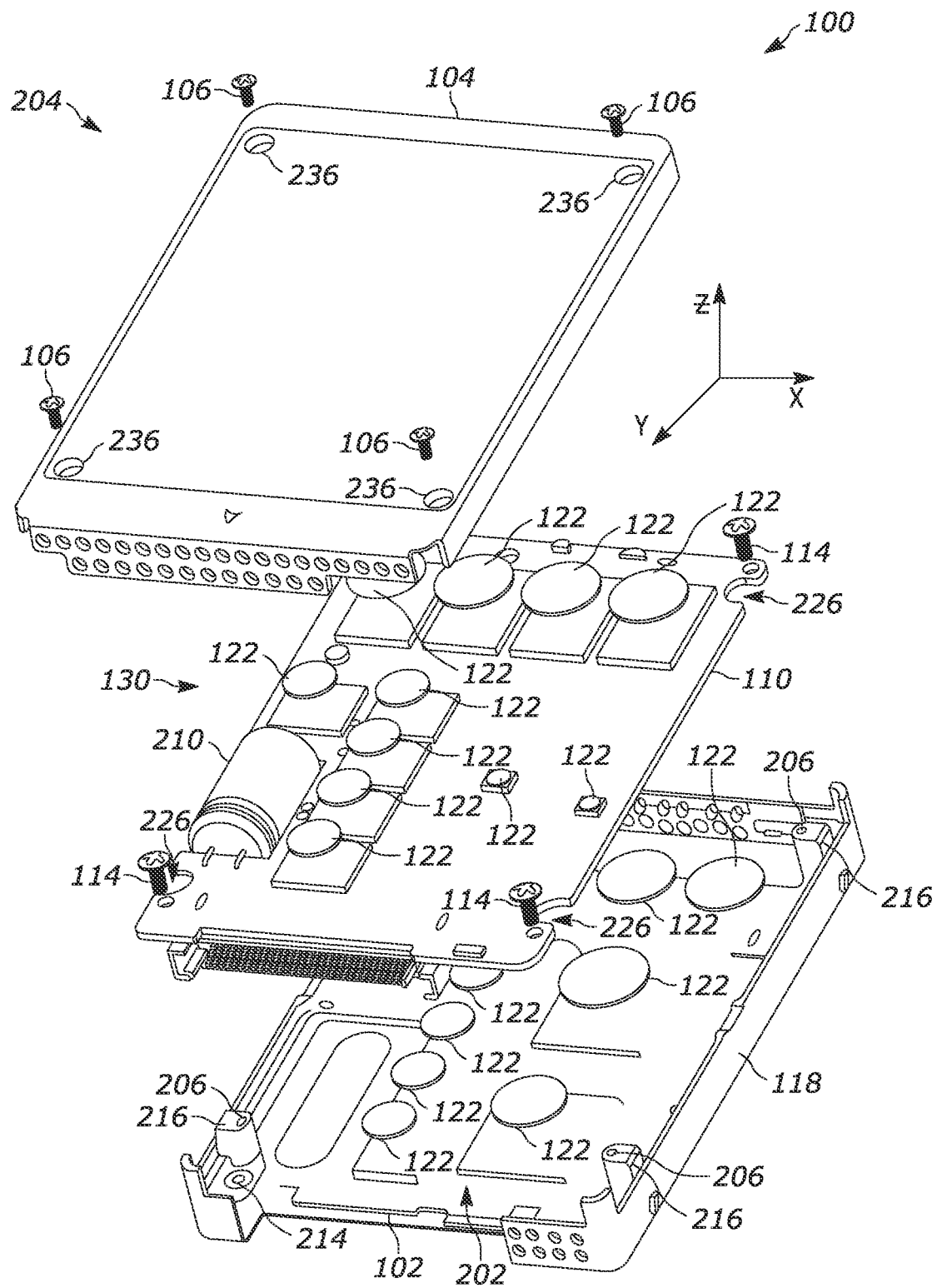
FIG. 2 is a three-dimensional perspective view of a device assembly according to another embodiment.

FIG. 2 is an exploded three-dimensional perspective view of device assembly 100 according to another embodiment. Reference labels used in FIG. 2 are generally consistent with the reference labels used in FIG. 1. As such, the description of some previously described elements and features of device assembly 100 are not repeated in reference to FIG. 2.

A main interior surface 202 of base 102 has multiple elevated features, such as steps or pedestals, on which the corresponding TIM parts 122 may be located, e.g., as indicated in the figure. The heights of such elevated features are selected in accordance with the vertical profile of the corresponding ICs attached to the bottom surface of PCB 110, e.g., such that the various TIM parts 122 are properly sandwiched between main interior surface 202 of base 102 and the facing surfaces of the corresponding ICs of PCBA 130. Example IC placement on the bottom surface of PCB 110 is described in more detail below in reference to FIG. 4.

Base 102 further comprises two sets of threaded screw holes 206, 214 (e.g., four such holes in each set) for accepting screws 106 and 114, respectively. More specifically, four threaded screw holes 206 are in four respective elevated piers 216, only three of which are visible in the view of FIG. 2. PCB 110 has four corresponding edge cutouts 226, into which elevated piers 216 can be fitted while maintaining gaps 116 around them (also see FIG. 1). Four threaded screw holes 214, only one of which is visible in the view of FIG. 2, are in the corner portions of base 102.

In the shown embodiment, PCBA 130 has an aluminum electrolytic capacitor 210 and a plurality of packaged ICs, e.g., 230, 240, 250, 260 (see FIGS. 4-5) mounted on PCB 110. PCB 110 has an appropriately sized cutout to accommodate capacitor 210 therein, e.g., as indicated in FIG. 2. Circuits IC1-IC3 shown in FIG. 1 may be considered as representative examples of some of the packaged ICs of FIG. 2. A first subset of the packaged ICs is mounted on the upper main surface of PCB 110, and a second subset of the packaged ICs is mounted on the lower main surface of the PCB. The first subset of the packaged ICs is provided with the corresponding TIM parts 122, e.g., as indicated in the figure. In the assembled form of device assembly 100, the TIM parts 122 are properly sandwiched between heat spreader 120 and the facing surfaces of the corresponding packaged ICs of the first subset. The second subset of the packaged ICs (not visible in the view of FIG. 2) is mated with the above-described set of TIM parts 122 on base 202. Additional description of the ICs of PCBA 130 is given below in reference to FIGS. 4-5.

A subassembly 204 comprises top lid 104 and heat spreader 120. Heat spreader 120 is not visible in the view of FIG. 2 (e.g., see FIG. 3). Top lid 104 has four recessed feedthrough holes 236 through which screws 106 can be inserted into threaded holes 206 of base 102. The shapes of the recesses may typically match the shapes of the heads of screws 106.

FIG. 3 is an exploded three-dimensional view of subassembly 204 of device assembly 100 according to an embodiment. The view of FIG. 3 has a flipped orientation with respect to the view of FIG. 2, which is indicated by the different orientations of the XYZ-coordinate triad in FIGS. 2 and 3. Heat spreader 120 has a set of legs 338, which are fixedly attached to the inner main surface of top lid 104 using pieces 348 of thermal adhesive tape. As already indicated above in reference to FIG. 1, a main surface of heat spreader 120 typically has a non-flat shape, e.g., may have steps and/or pedestals, the vertical profile of which matches the vertical profile of the corresponding packaged ICs mounted on the top surface of PCB 110. Hence, depending on the specific embodiment and circuit layout, different respective suitable shapes of heat spreader 120 may be used.

FIGS. 4-5 are plan views illustrating PCBA 130 according to example embodiments.

More specifically, FIG. 4 is a plan view illustrating the bottom surface of PCBA 130 according to an embodiment. FIG. 5 is a plan view illustrating the top surface of PCBA 130 according to an embodiment. Reference labels used in FIGS. 4-5 are consistent with the reference labels used in FIGS. 2-3.

The embodiments of PCBA 130 illustrated in FIGS. 4-5 may be used to implement a solid-state drive (SSD), e.g., based on NAND or NOR flash. In this case, packaged ICs 230 may be the flash-memory chips. Packaged ICs 240, 250 may be used to implement the SSD controller, with IC 240 implementing the processor of the SSD controller, and IC 250 implementing the dynamic random-access memory (DRAM) of the SSD controller. Packaged ICs 260 may be used to implement the power-management function of the SSD. Each of the packaged ICs 230, 240, 250, 260 is provided with a respective one of TIM parts 122 which, in the assembled form of device assembly 100, interface with the corresponding inner surfaces of the protective enclosure, e.g., as described above.

The bottom surface of PCB 110 (FIG. 4) has attached thereto the packaged ICs 240, some of the packaged ICs 230, and some of the packaged ICs 250. The top surface of PCB 110 (FIG. 5) has attached thereto the packaged ICs 260, some of the packaged ICs 230, and some of the packaged ICs 250. As shown, PCBA 130 also has a multi-pin connector 490 mounted near one of the edges of PCB 110. Connector 490 can be used, e.g., for plugging the SSD into a corresponding receptacle of the host device (not explicitly shown), e.g., a computer.

Figure 6:
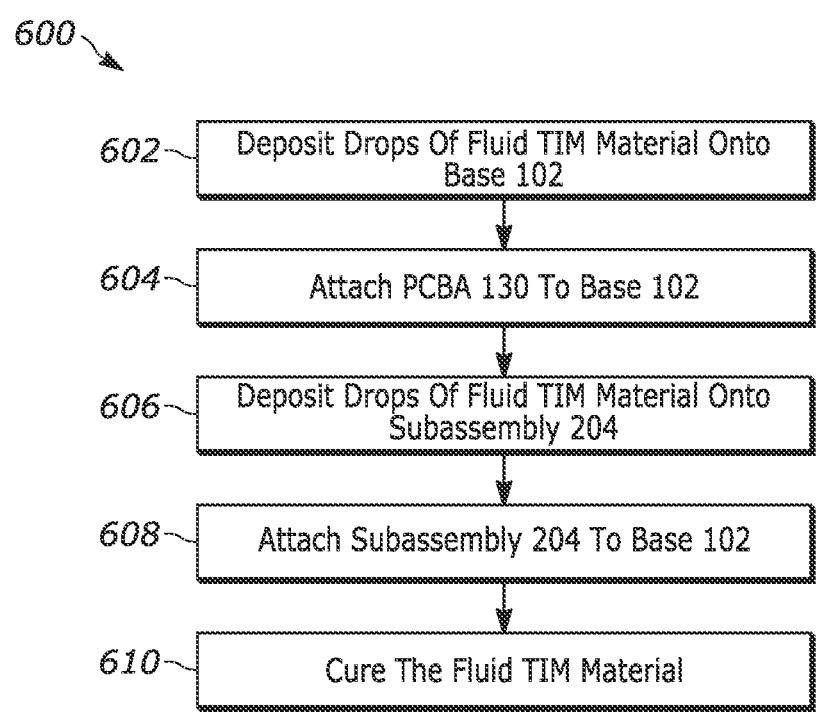
FIG. 6 is a flowchart illustrating a method of putting together the device assembly of FIG. 2 according to an embodiment.

FIG. 6 is a flowchart illustrating a method 600 of putting together device assembly 100 according to an embodiment. Method 600 is described below with continued reference to FIGS. 1-5 and with reference to FIG. 7.

Base 102 may be placed on a suitable flat surface in the orientation indicated in FIG. 2, i.e., with surface 202 facing up. In method 600, drops of an (uncured) liquid TIM material may be deposited (at block 602) onto surface 202 at appropriate locations, e.g., the locations indicated by the corresponding subset of labels 122 in FIG. 2. The drops may typically remain in place due to the surface tension and/or relatively high viscosity of the TIM fluid.

PCBA 130 may be lowered, in the orientation shown in FIG. 2, onto the base 102 previously loaded with the TIM drops. The packaged ICs on the lower surface of PCBA 130 eventually make contact with the fluid TIM drops on the surface of base 102, thereby causing the drops to spread laterally and adopt precursor shapes of the corresponding cured-liquid TIM parts 122. In method 600, PCBA 130 may be secured on base 102 by screws 114 (at block 604). In other embodiments, other suitable fastening elements and/or support pins may also be used for this purpose.

Subassembly 204 may be placed on the flat surface, e.g., next to the partial assembly previously described, in the orientation shown in FIG. 3. In method 600, drops 122' of an (uncured) liquid TIM material may be deposited onto the top-facing surface of heat spreader 120 at appropriate locations (at block 606).

FIG. 7 illustrates example placement of TIM drops 122' on the top-facing surface of heat spreader 120 according to an embodiment. Lid 104 is not explicitly shown in FIG. 7 for better clarity. In FIG. 7, the liquid-TIM drops are labeled 122' (as opposed to 122, FIG. 2) to indicate that the TIM material is still uncured at this manufacturing stage.

The partial assembly may be picked up, flipped over, and placed on top of subassembly 204, which has been TIM-primed as described above. In method 600, screws 106 may be inserted into holes 236 and tightened to connect and secure these two parts together (at block 608).

In method 600, the liquid TIM material may also be cured (at block 610). The curing of the liquid TIM material transforms the liquid TIM drops into the corresponding solid TIM parts 122.

According to an example embodiment disclosed above, e.g., in the summary section and/or in reference to any one or any combination of some or all of FIGS. 1-7, provided is an apparatus, comprising: an enclosure comprising a base (e.g., 102, FIG. 2) and a lid (e.g., 104, FIG. 2) attached to one another; a printed-circuit-board assembly (e.g., 130, FIG. 2) in the enclosure, the printed-circuit-board assembly comprising a printed circuit board (e.g., 110, FIG. 2) and a plurality of electronic components (e.g., packaged integrated circuits 230, 240, 250, 260, FIGS. 4, 5) attached to the printed circuit board; a heat spreader (e.g., 120, FIG. 2B) in the enclosure, the heat spreader being attached to the lid with portions of facing surfaces of the lid and the heat spreader being separated from each other by a non-zero distance (e.g., g, FIG. 1); and one or more first TIM parts (e.g., $122_1$, $122_2$, FIG. 1), each of the one or more first TIM parts being in contact with and vertically between the heat spreader and a corresponding one of the packaged integrated circuits. Herein, the term "electronic components" should be construed to cover packaged ICs, dies, discrete devices, and semiconductor dies. Examples of packaged ICs include a controller, an application specific IC (ASIC), and a power management IC. Examples of discrete devices include resistors, capacitors, and inductances. NAND dies may or may not be packaged.

In some embodiments of the above apparatus, the apparatus further comprises one or more second TIM parts (e.g., $122_3$, FIG. 1), each of the one or more second TIM parts being in contact with and vertically between the base and a respective one of the packaged integrated circuits.

In some embodiments of any of the above apparatus, the apparatus further comprises one or more third TIM parts (e.g., $122_4$, FIG. 1), each of the one or more third TIM parts being in contact with and vertically between the base and the printed circuit board.

In some embodiments of any of the above apparatus, the first, second, and third TIM parts are cured-liquid TIM parts.

In some embodiments of any of the above apparatus, the packaged integrated circuits are attached and electrically connected to the printed circuit board using solder joints (e.g., 112, FIG. 1).

In some embodiments of any of the above apparatus, the heat spreader is a stamped metal part.

In some embodiments of any of the above apparatus, the lid is another stamped metal part.

In some embodiments of any of the above apparatus, the base is a die-cast metal part.

In some embodiments of any of the above apparatus, a first portion of the facing surface of the heat spreader is at a first vertical distance from the lid; and wherein a second portion of the facing surface of the heat spreader is at a second vertical distance from the lid, the second distance being different from the first distance.

In some embodiments of any of the above apparatus, the heat spreader is flexible to allow for vertical displacement of a section of the facing surface thereof.

In some embodiments of any of the above apparatus, the base and the lid are attached to one another using one or more first screws (e.g., 106, FIGS. 1, 2), each of which is not in contact with the printed circuit board; and wherein the printed circuit board is attached to the base using one or more second screws (e.g., 114, FIGS. 1, 2), each of which is not in contact with the lid. A screw is an example of a fastening element. In other embodiments, other suitable fastening elements may also be used.

In some embodiments of any of the above apparatus, the packaged integrated circuits include one or more of the following: a flash memory chip (e.g., 230, FIGS. 4-5); a processor or controller chip (e.g., 240, FIG. 4); a dynamic random-access memory chip (e.g., 250, FIGS. 4-5); and a power-management chip (e.g., 260, FIG. 5).

In some embodiments of any of the above apparatus, the printed-circuit-board assembly implements a solid-state drive.

According to another example embodiment disclosed above, e.g., in the summary section and/or in reference to any one or any combination of some or all of FIGS. 1-7, provided is a manufacturing method, comprising: attaching (e.g., 604, FIG. 6) a printed-circuit-board assembly (e.g., 130, FIG. 2) to a base (e.g., 102, FIG. 2), the printed-circuit-board assembly comprising a printed circuit board (e.g., 110, FIG. 2) and a plurality of packaged integrated circuits (e.g., 230, 240, 250, 260, FIGS. 4-5) attached to the printed circuit board; depositing (e.g., 606, FIG. 6) one or more drops of a fluid thermal-interface material onto a subassembly (e.g., 204, FIGS. 2, 3) comprising a heat spreader (e.g., 120, FIG. 3) attached to a lid with portions of facing surfaces of the lid and the heat spreader being separated from each other by a non-zero distance (e.g., g, FIG. 1); and attaching (e.g., 608, FIG. 6) the subassembly to the base to enclose the printed-circuit-board assembly therebetween such that each of the one or more drops is in contact with and vertically between the heat spreader and a corresponding one of the packaged integrated circuits.

In some embodiments of the above method, the method further comprises curing (e.g., 610, FIG. 6) the drops.

In some embodiments of any of the above methods, the method further comprises depositing (e.g., 602, FIG. 6) additional drops of the fluid TIM onto the base prior to the attaching the printed-circuit-board assembly to the base.

In some embodiments of any of the above methods, the packaged integrated circuits are attached and electrically connected to the printed circuit board using solder joints (e.g., 112, FIG. 1).

In some embodiments of any of the above methods, the heat spreader is a stamped metal part; wherein the lid is another stamped metal part; and wherein the base is a die-cast metal part.

In some embodiments of any of the above methods, the heat spreader is flexible to allow for vertical displacement of a section of the facing surface thereof.

In some embodiments of any of the above methods, the packaged integrated circuits include one or more of the following: a flash memory chip (e.g., 230, FIGS. 4-5); a processor or controller chip (e.g., 240, FIG. 4); a dynamic random-access memory chip (e.g., 250, FIGS. 4, 5); and a power-management chip (e.g., 260, FIG. 5).

In some embodiments of any of the above methods, the printed-circuit-board assembly implements a solid-state drive.

According to yet another example embodiment disclosed above, e.g., in the summary section and/or in reference to any one or any combination of some or all of FIGS. 1-7, provided is a solid-state drive made using a manufacturing method (e.g., 600, FIG. 6), the manufacturing method comprising: attaching (e.g., 604, FIG. 6) a printed-circuit-board assembly (e.g., 130, FIG. 2) to a base (e.g., 102, FIG. 2), the printed-circuit-board assembly comprising a printed circuit board (e.g., 110, FIG. 2) and a plurality of packaged integrated circuits (e.g., 230, 240, 250, 260, FIGS. 4-5) attached to the printed circuit board; depositing (e.g., 606, FIG. 6) one or more drops of a fluid thermal-interface material onto a subassembly (e.g., 204, FIGS. 2, 3) comprising a heat spreader (e.g., 120, FIG. 3) attached to a lid with portions of facing surfaces of the lid and the heat spreader being separated from each other by a non-zero distance (e.g., g, FIG. 1); and attaching (e.g., 608, FIG. 6) the subassembly to the base to enclose the printed-circuit-board assembly therebetween such that each of the one or more drops is in contact with and vertically between the heat spreader and a corresponding one of the packaged integrated circuits.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

Unless explicitly stated otherwise, each numerical value and range should be interpreted as being approximate as if the word "about" or "approximately" preceded the value or range.

The use of figure numbers and/or figure reference labels (if any) in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three-dimensional structure as shown in the figures. Such "height" would be vertical where the layers are horizontal but would be horizontal where the layers are vertical, and so on. Similarly, while all figures show the different layers as horizontal layers such orientation is for descriptive purpose only and not to be construed as a limitation.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. The same type of distinction applies to the use of terms "attached" and "directly attached," as applied to a description of a physical structure. For example, a relatively thin layer of adhesive or other suitable binder can be used to implement such "direct attachment" of the two corresponding components in such physical structure.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

As used in this application, the terms "circuit" and "circuitry" may refer to one or more or all of the following: (a) hardware-only circuit implementations (such as implementations in only analog and/or digital circuitry); (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions); and (c) hardware circuit(s) and or processor(s), such as a microprocessor(s) or a portion of a microprocessor(s), that requires software (e.g., firmware) for operation, but the software may not be present when it is not needed for operation." This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

"SUMMARY" in this specification is intended to introduce some example embodiments, with additional embodiments being described in "DETAILED DESCRIPTION" and/or in reference to one or more drawings. "SUMMARY" is not intended to identify essential elements or features of the claimed subject matter, nor is it intended to limit the scope of the claimed subject matter.

"ABSTRACT" is provided to allow the reader to quickly ascertain the nature of the technical disclosure. It is submitted with the understanding that it will not be used to interpret or limit the scope or meaning of the claims. In addition, in the foregoing "DETAILED DESCRIPTION," it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into "DETAILED DESCRIPTION," with each claim standing on its own as a separately claimed subject matter.

What is claimed is:

1. An apparatus, comprising:
   an enclosure comprising a base and a lid attached to one another;
   a printed-circuit-board assembly in the enclosure, the printed-circuit-board assembly comprising a printed circuit board and a plurality of electronic components attached to the printed circuit board;
   a heat spreader in the enclosure, the heat spreader being a stamped sheet-metal part having a plurality of legs, each of the legs being fixedly attached to an inner main surface of the lid; and
   one or more first thermal-interface-material (TIM) parts, each of the one or more first TIM parts being in contact with and vertically between the heat spreader and a corresponding one of the electronic components,
   wherein the stamped sheet-metal part is shaped such that:
      a first flat portion of the stamped sheet-metal part facing the inner main surface of the lid is at a first nonzero vertical distance from the inner main surface and is parallel to the inner main surface; and
      a second flat portion of the stamped sheet-metal part facing the inner main surface of the lid is at a second vertical distance from the inner main surface and is parallel to the inner main surface, the second vertical distance being larger than the first nonzero vertical distance.

2. The apparatus of claim 1, further comprising one or more second TIM parts, each of the one or more second TIM parts being in contact with and vertically between the base and a respective one of the electronic components.

3. The apparatus of claim 2, further comprising one or more third TIM parts, each of the one or more third TIM parts being in contact with and vertically between the base and the printed circuit board.

4. The apparatus of claim 3, wherein the first, second, and third TIM parts are cured-liquid TIM parts.

5. The apparatus of claim 1, wherein the electronic components are attached and electrically connected to the printed circuit board using solder joints.

6. The apparatus of claim 1, wherein the stamped sheet-metal part is flexible to allow for vertical displacement of a section thereof when the printed-circuit-board assembly is subjected to thermal cycling.

7. The apparatus of claim 1,
wherein the base and the lid are attached to one another using one or more first fastening elements, each of which is not in contact with the printed circuit board; and
wherein the printed circuit board is attached to the base using one or more second fastening elements, each of which is not in contact with the lid.

8. The apparatus of claim 1, wherein the electronic components include one or more of the following:
a flash memory chip;
a processor or controller chip;
a dynamic random-access memory chip; and
a power-management chip.

9. The apparatus of claim 1, wherein the apparatus comprises a solid-state drive.

10. The apparatus of claim 1, further comprising one or more second TIM parts, each of the one or more second TIM parts being in contact with and vertically between a respective one of the legs of the stamped sheet-metal part and a respective portion of the inner main surface of the lid.

11. The apparatus of claim 10, wherein each one of the second TIM parts is a piece of thermal adhesive tape.

12. The apparatus of claim 1, wherein the plurality of legs includes more than four legs.

13. The apparatus of claim 1, wherein neither the first flat portion nor the second flat portion of the stamped sheet-metal part is in direct contact with the lid.

14. A manufacturing method, comprising:
attaching a printed-circuit-board assembly to a base, the printed-circuit-board assembly comprising a printed circuit board and a plurality of electronic components attached to the printed circuit board;
forming a sub-assembly by attaching a heat spreader to a lid, the heat spreader being a stamped sheet-metal part having a plurality of legs, each of the legs being fixedly attached to an inner main surface of the lid;
depositing one or more drops of a fluid thermal-interface material onto the subassembly; and
attaching the subassembly to the base to enclose the printed-circuit-board assembly therebetween such that each of the one or more drops is in contact with and vertically between the heat spreader and a corresponding one of the electronic components,
wherein the stamped sheet-metal part is shaped such that after the attaching:
a first flat portion of the stamped sheet-metal part facing the inner main surface of the lid is at a first nonzero vertical distance from the inner main surface and is parallel to the inner main surface; and
a second flat portion of the stamped sheet-metal part facing the inner main surface of the lid is at a second vertical distance from the inner main surface and is parallel to the inner main surface, the second vertical distance being larger than the first nonzero vertical distance.

15. The method of claim 14, further comprising curing the drops.

16. The method of claim 14, further comprising depositing additional drops of the fluid TIM onto the base prior to the attaching the printed-circuit-board assembly to the base.

17. The method of claim 14, wherein the electronic components are attached and electrically connected to the printed circuit board using solder joints.

18. The method of claim 14, wherein the stamped sheet-metal part is flexible to allow for vertical displacement of a section thereof when the printed-circuit-board assembly is subjected to thermal cycling.

19. The method of claim 14, further comprising:
attaching the base and the lid to one another using one or more first fastening elements, each of which is not in contact with the printed circuit board; and
attaching the printed circuit board to the base using one or more second fastening elements, each of which is not in contact with the lid.

20. The method of claim 14, wherein the printed-circuit-board assembly implements a solid-state drive.

* * * * *